United States Patent
Chen et al.

(10) Patent No.: US 7,763,529 B2
(45) Date of Patent: Jul. 27, 2010

(54) METHOD OF FABRICATING SILICON CARBIDE (SIC) LAYER

(75) Inventors: Wei-Yu Chen, Hsin-Chu (TW);
Jenn-Chang Hwang, Hsin-Chu (TW);
Chih-Fang Huang, Hsin-Chu (TW);
Chien-Cheng Chen, Hsin-Chu (TW)

(73) Assignee: National Tsing Hua University, Hsinchu (TW)

( * ) Notice: Subject to any disclaimer, the term of this patent is extended or adjusted under 35 U.S.C. 154(b) by 0 days.

(21) Appl. No.: 12/585,811

(22) Filed: Sep. 25, 2009

(65) Prior Publication Data
US 2010/0081261 A1    Apr. 1, 2010

(30) Foreign Application Priority Data
Oct. 1, 2008    (TW) .............................. 97137650 A

(51) Int. Cl.
| | |
|---|---|
| H01L 21/20 | (2006.01) |
| H01L 21/36 | (2006.01) |
| C30B 23/00 | (2006.01) |
| C30B 25/00 | (2006.01) |
| C30B 28/12 | (2006.01) |
| C30B 28/14 | (2006.01) |
| B32B 9/00 | (2006.01) |
| B32B 19/00 | (2006.01) |

(52) U.S. Cl. ...................... 438/478; 438/931; 117/90; 117/107; 257/E21.065; 428/698

(58) Field of Classification Search ................. 438/478, 438/931; 428/698; 117/90, 104, 84, 107, 117/94; 257/E21.065, E21.697, E27.012
See application file for complete search history.

(56) References Cited

U.S. PATENT DOCUMENTS

| | | | | |
|---|---|---|---|---|
| 4,855,254 | A | * | 8/1989 | Eshita et al. ................... 117/94 |
| 5,667,586 | A | * | 9/1997 | Ek et al. ........................ 117/84 |
| 5,964,944 | A | * | 10/1999 | Sugiyama et al. ........... 117/107 |
| 2004/0081798 | A1 | * | 4/2004 | Lee et al. ..................... 428/141 |
| 2008/0173239 | A1 | * | 7/2008 | Makarov et al. ............. 118/724 |
| 2008/0173242 | A1 | * | 7/2008 | Makarov et al. ............. 118/728 |
| 2008/0234122 | A1 | * | 9/2008 | Jorge et al. ..................... 501/92 |
| 2009/0038541 | A1 | * | 2/2009 | Robbins et al. ............. 117/104 |
| 2009/0045412 | A1 | * | 2/2009 | Udagawa ..................... 257/77 |
| 2009/0302030 | A1 | * | 12/2009 | Quantrille et al. ........... 219/678 |
| 2010/0024719 | A1 | * | 2/2010 | VanMil et al. ................ 117/86 |
| 2010/0025696 | A1 | * | 2/2010 | Abbondanza et al. ......... 257/77 |
| 2010/0081261 | A1 | * | 4/2010 | Chen et al. .................. 438/478 |

* cited by examiner

*Primary Examiner*—Walter L Lindsay, Jr.
(74) *Attorney, Agent, or Firm*—Bacon & Thomas, PLLC

(57) ABSTRACT

A method of fabricating a silicon carbide (SiC) layer is disclosed, which comprises steps: (S1) heating a silicon-based substrate at a temperature of X ° C.; (S2) carburizing the silicon-based substrate with a first hydrocarbon-containing gas at a temperature of Y ° C. to form a carbide layer on the silicon-based substrate; (S3) annealing the silicon-based substrate with the carbide layer thereon at a temperature of Z ° C.; and (S4) forming a silicon carbide layer on the carbide layer with a second hydrocarbon-containing gas and a silicon-containing gas at a temperature of W ° C.; wherein, X is 800 to 1200; Y is 1100 to 1400; Z is 1200 to 1500; W is 1300 to 1550; and $X<Y\leq Z\leq W$. In the method of the present invention, since no cooling steps between respective steps are required, the full process time can be reduced and the cost is lowered because no energy consumption occurs for the cooling and the re-heating steps.

15 Claims, 2 Drawing Sheets

METHOD OF FABRICATING SILICON CARBIDE (SiC) LAYER

BACKGROUND OF THE INVENTION

1. Field of the Invention

The present invention relates to a method of fabricating a silicon carbide (SiC) layer and, more particularly, to a method of fabricating a silicon carbide (SiC) layer on a silicon substrate.

2. Description of Related Art

Currently, the growth of silicon carbide on a silicon substrate is a privileged way to obtain cubic SiC layers of large dimensions. The advantages of using silicon as a substrate for the growth of SiC are its low cost, availability in large dimensions, and ability to directly form a cubic SiC layer by carburizing. The difficulty to grow an SiC layer of good quality on an Si substrate is due to the large lattice-mismatch and the difference in thermal expansion coefficients between Si and SiC.

In 1983, Nishino et al. proposed a method of producing an SiC layer on an Si substrate, wherein they utilized a buffer layer on the Si substrate before the carburization process of SiC growth, and the growth of a single crystal SiC of larger area on Si was realized (Nishino, S.; Powell, J. A.; Hill, H. A. Appl. Phys. Lett. 1983, 42, 460-462). Therefore, the concept of using a buffer layer for the forming of the SiC layer has been intensively used by other research groups in the past years.

In a conventional method for growing an SiC layer on an Si substrate, as shown in FIG. 1, three process steps are usually included, which comprise (a) cleaning, (b) carburization, and (c) growth steps. However, the conventional three-step method is disadvantageous in time consumption since cooling steps are needed to be interposed between respective steps of the process to obtain good crystal quality. In detail, a conventional method for growing an SiC layer on an Si substrate should be interpreted as totally comprising the following sequent steps: (a) cleaning, (a1) cooling (and re-heating), (b) carburization, (b1) cooling (and re-heating), and (c) growth. Besides, considerable energy is involved in the cooling and the re-heating steps between those cleaning, carburization, and growth steps, therefore the total manufacturing cost increases as the electrical quantity consumed is very high.

Since the crystal quality of the SiC layer relates to the performing of the cooling step in the conventional method for growing an SiC layer on an Si substrate, if the cooling processes interposed between the cleaning, carburization, and growth steps are omitted, the crystallinity of the obtained SiC layer will be unsatisfactory. Hence, as for the conventional methods, those cooling and the re-heating steps are essential in order to maintain the good crystal quality of the provided SiC layer.

Besides, the appearance of voids (i.e. holes) in the SiC/Si interface is also a serious problem, which may cause negative influence on the electrical performance of the SiC layer.

Therefore, it is desirable to provide an improved method for growing an SiC layer on an Si substrate to meet the requirements of being quick, low-cost, void-free, and having high crystal quality simultaneously.

SUMMARY OF THE INVENTION

The present invention provides a method of fabricating a silicon carbide (SiC) layer, comprising the following steps: (S1) heating a silicon-based substrate at a temperature of $X\,^\circ$ C.; (S2) carburizating the silicon-based substrate with a first hydrocarbon-containing gas at a temperature of $Y\,^\circ$ C. to form a carbide layer on the silicon-based substrate; (S3) annealing the silicon-based substrate with the carbide layer thereon at a temperature of $Z\,^\circ$ C.; and (S4) forming a silicon carbide layer on the carbide layer with a second hydrocarbon-containing gas and a silicon-containing gas at a temperature of $W\,^\circ$ C.; wherein, X is 800 to 1200; Y is 1100 to 1400; Z is 1200 to 1500; W is 1300 to 1550; and $X<y\leq Z\leq W$.

According to the method of fabricating a silicon carbide (SiC) layer of the present invention, since no cooling steps between respective steps are required, the full process time can be reduced and the cost is lowered because no energy consumption occurs for the cooling and the re-heating steps. Besides, a high crystal quality of the silicon carbide layer is obtained, and the problem of appearance of voids in the SiC/Si (100) interface can be overcome. Therefore, the method of the present invention is indeed a practical and inventive novel method for the fabricating of the silicon carbide (SiC) layer.

According to the method of fabricating a silicon carbide (SiC) layer of the present invention, preferably X may be 850 to 950, Y may be 1200 to 1300, Z may be 1300 to 1400, and W may be 1400 to 1450.

According to the method of fabricating a silicon carbide (SiC) layer of the present invention, the first hydrocarbon-containing gas of step (S2) may be a substituted or unsubstituted hydrocarbon-containing gas, and is preferably selected from the group consisting of: alkane, alkene, alkyne, and the mixtures thereof.

According to the method of fabricating a silicon carbide (SiC) layer of the present invention, wherein the second hydrocarbon-containing gas of step (S4) may be a substituted or unsubstituted hydrocarbon-containing gas, and is preferably selected from the group consisting of: alkane, alkene, alkyne, and the mixtures thereof.

According to the method of fabricating a silicon carbide (SiC) layer of the present invention, wherein the silicon-containing gas of step (S4) is preferably selected from the group consisting of: silane, and the mixtures thereof.

According to the method of fabricating a silicon carbide (SiC) layer of the present invention, the step (S1) preferably may be: heating the silicon-based substrate with a hydrogen gas at a temperature of $X\,^\circ$ C. The inducted hydrogen gas assists the removing of the impurities locating on the surface of the silicon-based substrate.

According to the method of fabricating a silicon carbide (SiC) layer of the present invention, the step (S2) preferably may be: carburizating the cleaned silicon-based substrate with a hydrogen gas and the first hydrocarbon-containing gas at a temperature of $Y\,^\circ$ C. to form a carbide layer on the cleaned silicon-based substrate. The inducted hydrogen gas can contribute to the adjusting of the reacting pressure.

According to the method of fabricating a silicon carbide (SiC) layer of the present invention, the flow rate of the first hydrocarbon-containing gas of step (S2) preferably can be 8 sccm or above.

According to the method of fabricating a silicon carbide (SiC) layer of the present invention, the step (S3) preferably may be: annealing the silicon based substrate with the carbide layer thereon with a hydrogen gas at a temperature of $Z\,^\circ$ C. The inducted hydrogen gas can contribute to the adjusting of the reacting pressure.

According to the method of fabricating a silicon carbide (SiC) layer of the present invention, the step (S4) preferably may be: forming a silicon carbide layer on the carbide layer with a hydrogen gas, the second hydrocarbon-containing gas, and the silicon-containing gas at a temperature of W ° C. The inducted hydrogen gas can contribute to the adjusting of the reacting pressure.

According to the method of fabricating a silicon carbide (SiC) layer of the present invention, each temperature between the respective steps is preferably not lower than the temperature of the previous step. In detail, no cooling between respective steps is required. Before the last step (S4) is completed, the temperature should be controlled not to decrease.

According to the method of fabricating a silicon carbide (SiC) layer of the present invention, the silicon-based substrate in the step (S1) is preferably a (100) silicon substrate, more preferably a P-type Si (100) substrate.

Other objects, advantages, and novel features of the invention will become more apparent from the following detailed description when taken in conjunction with the accompanying drawings.

DETAILED DESCRIPTION OF THE PREFERRED EMBODIMENT

Example

Figure 1:
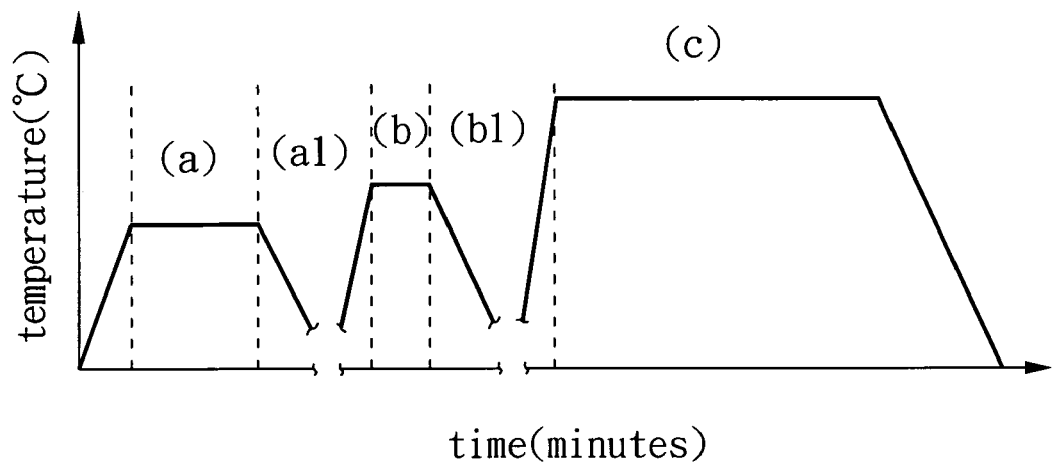
FIG. 1 is a schematic view of a conventional method of growing an SiC layer on an Si substrate.
Figure 2:
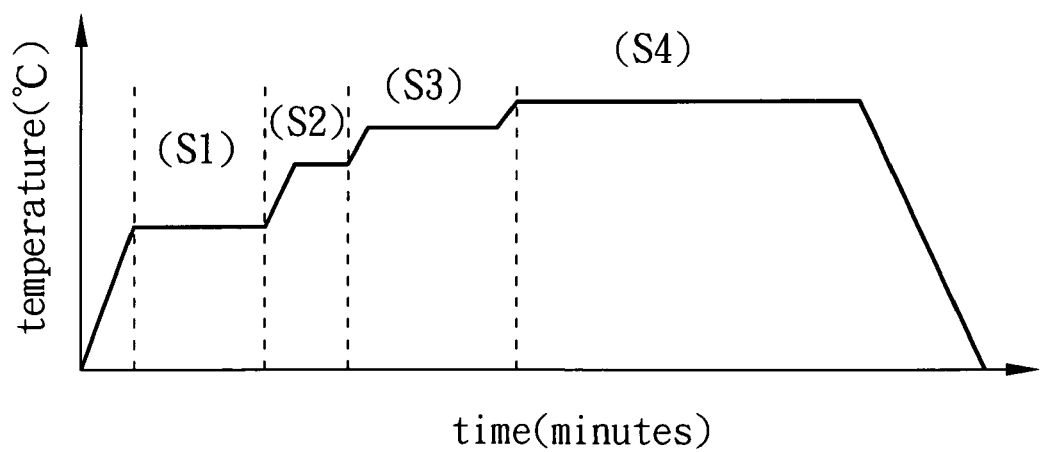
FIG. 2 is a schematic view of the method of growing an SiC layer on an Si substrate of the present invention.

Reference with FIG. 2, a schematic view of the method of growing an SiC layer on an Si substrate of the present example is shown.

A P-type Si(100) substrate is dipped in 1% HF for 30 seconds and rinsed with deionized water. Then the Si(100) substrate is transferred into a chamber that is vacuum-pumped to $1.7 \times 10^{-2}$ torr followed by the induction of hydrogen gas into the chamber to 10 torr. The temperature of the chamber is raised to 900° C. at the rate of 11° C./second, and the temperature of 900° C. is kept for about 5 minutes to remove impurities on the Si(100) substrate (S1).

The hydrogen gas is continuously provided. A first hydrocarbon-containing gas with a flow rate of 10 sccm is then inducted into the chamber, and the pressure in the chamber is adjusted to 2 torr by controlling the flow rate of the hydrogen gas. Herein, the first hydrocarbon-containing gas used is 99.95% propane. The temperature is raised to about 1250° C. and kept for 90 seconds to perform carburizating and a carbide layer on the Si(100) substrate (S2) is formed.

Subsequently, after the growing of the carbide layer, the providing of the first hydrocarbon-containing gas is stopped, the pressure in the chamber is maintained in 2 torr with the hydrogen gas, and the temperature is raised to about 1350° C. and kept for 5 minutes to perform an annealing step (S3).

After the annealing step (S3), a second hydrocarbon-containing gas and a silicon-containing gas are induced into the chamber with flow rates of 3 sccm and 20 sccm respectively. Herein, the second hydrocarbon-containing gas and the silicon-containing gas used are 99.95% propane and 5% silane diluted with hydrogen, respectively. The pressure in the chamber is adjusted to 0.8 ton, and the temperature is raised to about 1420° C. and kept for 30 minutes to grow a silicon carbide layer on the carbide layer locating on the Si(100) substrate (S4).

According to the method of fabricating a silicon carbide (SiC) layer of the present invention, since no cooling steps between respective steps are required, the full process time can be reduced and the cost is lowered because no energy consumption occurs for the cooling and the re-heating steps.

[Testing Example]

Figure 3:
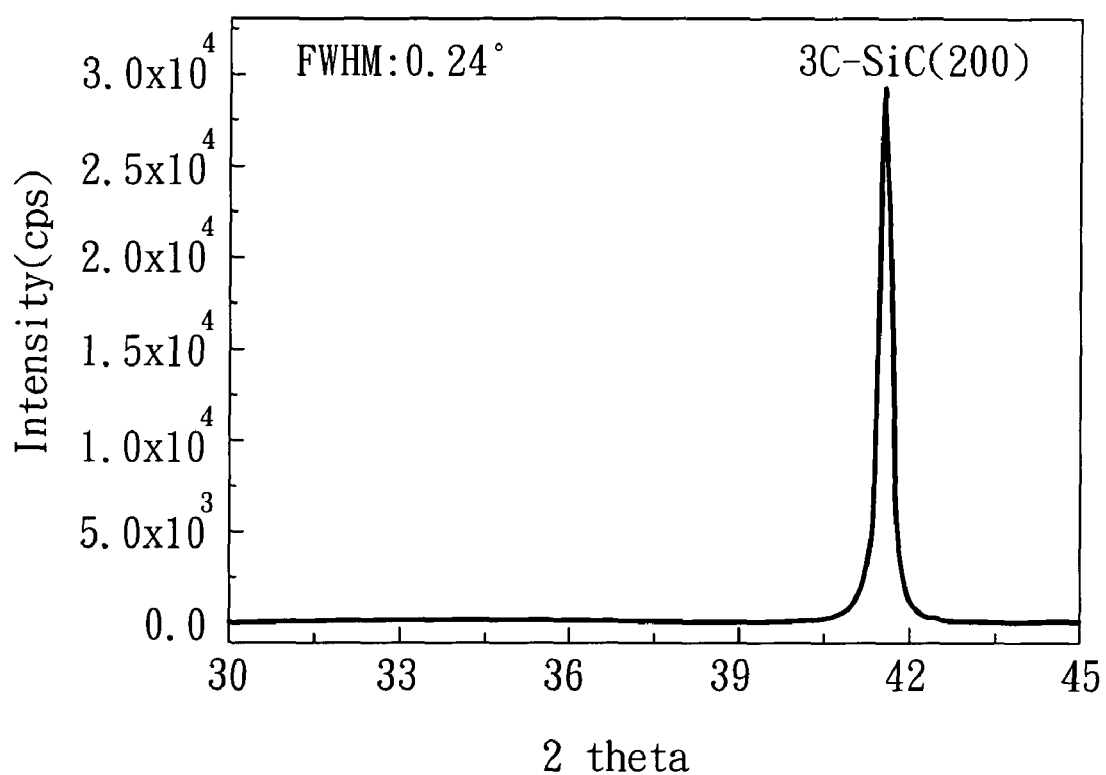
FIG. 3 is the XRD analysis result of the SiC layer provided from the example of the present invention.

The silicon carbide (SiC) layer produced from the example is taken to XRD analysis, and the result is shown in FIG. 3. As from the XRD analysis result, it is known that a peak of $2\theta=41.5°$ represents the (200) surface reflection of the silicon carbide, which has an FWHM (full width at half maximum) of 0.24°. Simultaneously, no other impure signals are present, which means a high crystal quality of the silicon carbide layer is obtained.

Besides, from the SEM result (not shown), it is proved that the voids appearing between the SiC layer and the Si substrate produced from the conventional method are not observed in the SiC/Si (100) interface of the present invention. The removal of voids at the interface is mainly attributed to the high propane flow rate used in the carburization step (S2). This results in high nucleation density of carbon and forms a thin carbon connected layer on Si(100) quickly. The quick formation of the thin carbon layer on Si(100) is crucial in avoiding the diffusion of Si atoms out of Si(100) at high temperature. In this connection, the voids are not observed in the SiC/Si (100) interface of the present invention, but significant amounts appear in the SiC/Si interface of the prior arts.

As mentioned above, according to the method of fabricating a silicon carbide (SiC) layer of the present invention, which comprises four continuous steps without cooling steps interposed between them, since no cooling steps between respective steps are required, the full process time can be reduced and the cost is lowered because no energy consumption occurs for the cooling and the re-heating steps. Besides, from the XRD analysis result, it is known that a high crystal quality of the silicon carbide layer is obtained. Also, from the SEM result, it can be seen that the problem of the appearance of voids in the SiC/Si (100) interface is overcome. Therefore, the method of the present invention is indeed a practical and inventive novel method for the fabricating of the silicon carbide (SiC) layer.

Although the present invention has been explained in relation to its preferred embodiment, it is to be understood that many other possible modifications and variations can be made without departing from the scope of the invention as hereinafter claimed.

What is claimed is:

1. A method of fabricating a silicon carbide (SiC) layer, comprising following steps:
   (S1) heating a silicon-based substrate at a temperature of X ° C.;
   (S2) carburizating the silicon-based substrate with a first hydrocarbon-containing gas at a temperature of Y ° C. to form a carbide layer on the silicon-based substrate;
   (S3) annealing the silicon-based substrate with the carbide layer thereon at a temperature of Z ° C.; and
   (S4) forming a silicon carbide layer on the carbide layer with a second hydrocarbon-containing gas and a silicon-containing gas at a temperature of W ° C.;
   wherein, X is 800 to 1200; Y is 1100 to 1400; Z is 1200 to 1500; W is 1300 to 1550; and $X < y \leq Z \leq W$.

2. The method of fabricating a silicon carbide (SiC) layer as claimed in claim 1, wherein X is 850 to 950.

3. The method of fabricating a silicon carbide (SiC) layer as claimed in claim 1, wherein Y is 1200 to 1300.

4. The method of fabricating a silicon carbide (SiC) layer as claimed in claim 1, wherein Z is 1300 to 1400.

5. The method of fabricating a silicon carbide (SiC) layer as claimed in claim 1, wherein W is 1400 to 1450.

6. The method of fabricating a silicon carbide (SiC) layer as claimed in claim 1, wherein the first hydrocarbon-containing gas of step (S2) is selected from the group consisting of: alkane, alkene, alkyne, and the mixtures thereof.

7. The method of fabricating a silicon carbide (SiC) layer as claimed in claim 1, wherein the second hydrocarbon-containing gas of step (S4) is selected from the group consisting of: alkane, alkene, alkyne, and the mixtures thereof.

8. The method of fabricating a silicon carbide (SiC) layer as claimed in claim 1, wherein the silicon-containing gas of step (S4) is selected from the group consisting of: silane, and the mixtures thereof.

9. The method of fabricating a silicon carbide (SiC) layer as claimed in claim 1, wherein the step (S1) is: heating the silicon-based substrate with a hydrogen gas at a temperature of X ° C.

10. The method of fabricating a silicon carbide (SiC) layer as claimed in claim 1, wherein the step (S2) is: carburizating the cleaned silicon-based substrate with a hydrogen gas and the first hydrocarbon-containing gas at a temperature of Y ° C. to form a carbide layer on the cleaned silicon-based substrate.

11. The method of fabricating a silicon carbide (SiC) layer as claimed in claim 1, wherein the flow rate of the first hydrocarbon-containing gas of step (S2) is 8 sccm or above.

12. The method of fabricating a silicon carbide (SiC) layer as claimed in claim 1, wherein the step (S3) is: annealing the silicon-based substrate with the carbide layer thereon with a hydrogen gas at a temperature of Z ° C.

13. The method of fabricating a silicon carbide (SiC) layer as claimed in claim 1, wherein the step (S4) is: forming a silicon carbide layer on the carbide layer with a hydrogen gas, the second hydrocarbon-containing gas, and the silicon-containing gas at a temperature of W ° C.

14. The method of fabricating a silicon carbide (SiC) layer as claimed in claim 1, wherein each temperature between the respective steps is not lower than the temperature of the previous step.

15. The method of fabricating a silicon carbide (SiC) layer as claimed in claim 1, wherein the silicon-based substrate in the step (S1) is a (100) silicon substrate.

* * * * *